United States Patent
Gu et al.

(10) Patent No.: US 8,810,331 B2
(45) Date of Patent: Aug. 19, 2014

(54) MEMS TUNABLE NOTCH FILTER FREQUENCY AUTOMATIC CONTROL LOOP SYSTEMS AND METHODS

(75) Inventors: Qizheng Gu, San Diego, CA (US); Javier Rodriguez De Luis, Kirkland, WA (US); Arthur S. Morris, III, Raleigh, NC (US)

(73) Assignee: Wispry, Inc., Irvine, CA (US)

( * ) Notice: Subject to any disclaimer, the term of this patent is extended or adjusted under 35 U.S.C. 154(b) by 305 days.

(21) Appl. No.: 13/323,485

(22) Filed: Dec. 12, 2011

(65) Prior Publication Data

US 2012/0286892 A1  Nov. 15, 2012

Related U.S. Application Data

(60) Provisional application No. 61/459,303, filed on Dec. 10, 2010.

(51) Int. Cl.
*H03H 7/01* (2006.01)
*H03H 9/54* (2006.01)
*H03H 9/64* (2006.01)
*H03H 7/00* (2006.01)

(52) U.S. Cl.
CPC ............. *H03H 7/0153* (2013.01); *H03H 9/547* (2013.01); *H03H 9/6409* (2013.01); *H03H 2007/013* (2013.01); *H03H 2007/008* (2013.01)
USPC .......................................... 333/17.1; 333/174

(58) Field of Classification Search
CPC ... H03H 7/0153; H03H 9/547; H03H 9/6409; H03H 2007/013; H03H 2007/008
USPC ...................... 333/17.1, 17.2, 17.3, 174–176, 333/185–187, 189, 193, 205, 207, 209
See application file for complete search history.

(56) References Cited

U.S. PATENT DOCUMENTS

| | | | | |
|---|---|---|---|---|
| 4,426,630 A | * | 1/1984 | Folkmann | 333/174 |
| 5,019,792 A | * | 5/1991 | DiBiase et al. | 333/17.1 |
| 5,231,407 A | | 7/1993 | McGirr et al. | |
| 5,317,289 A | * | 5/1994 | Konishi et al. | 333/17.1 |

(Continued)

FOREIGN PATENT DOCUMENTS

| | | |
|---|---|---|
| KR | 2005 0069746 | 7/2005 |
| WO | WO 2007-025309 | 3/2007 |
| WO | WO 2012/027703 | 3/2012 |
| WO | WO 2012/097084 | 6/2012 |

OTHER PUBLICATIONS

Rowell, "A Capacitively Loaded PIFA for Compact Mobile Telephone Handsets," IEEE Transactions on Antennas and Propagation, May 1997, vol. 45, No. 5, pp. 837-842.

(Continued)

*Primary Examiner* — Barbara Summons
(74) *Attorney, Agent, or Firm* — Jenkins, Wilson, Taylor & Hunt, P.A.

(57) ABSTRACT

Tunable notch filters and control loop systems and methods can include a tunable notch filter providing a stop band, a sensing circuit in communication with the tunable notch filter and adapted to determine a phase change between a reference signal and a signal reflected from the tunable notch filter, and a control loop in communication with the tunable notch filter and the sensing circuit, the control loop being operable to adjust the tunable notch filter to modify the phase change.

18 Claims, 10 Drawing Sheets

(56) References Cited

U.S. PATENT DOCUMENTS

| | | | |
|---|---|---|---|
| 5,420,552 A * | 5/1995 | Sakka | 333/17.1 |
| 5,757,247 A * | 5/1998 | Koukkari et al. | 333/17.1 |
| 6,061,024 A | 5/2000 | McGirr et al. | |
| 6,333,719 B1 | 12/2001 | Varadan | |
| 6,735,418 B1 | 5/2004 | MacNally et al. | |
| 7,035,611 B2 | 4/2006 | Garlepp et al. | |
| 7,116,952 B2 | 10/2006 | Arafa | |
| 7,283,793 B1 | 10/2007 | McKay | |
| 7,446,628 B2 | 11/2008 | Morris | |
| 7,865,149 B2 | 1/2011 | Han et al. | |
| 8,073,400 B2 | 12/2011 | Gorbachov | |
| 8,106,848 B2 | 1/2012 | Rofougaran | |
| 8,170,510 B2 | 5/2012 | Knudsen | |
| 8,311,496 B2 | 11/2012 | Rofougaran | |
| 2001/0017602 A1 | 8/2001 | Hieb | |
| 2002/0140612 A1 | 10/2002 | Kadambi | |
| 2002/0183013 A1 * | 12/2002 | Auckland et al. | 455/73 |
| 2004/0087341 A1 | 5/2004 | Edvardsson | |
| 2004/0127178 A1 | 7/2004 | Kuffner | |
| 2005/0057399 A1 | 3/2005 | Kipnis | |
| 2005/0164647 A1 | 7/2005 | Shamsaifar | |
| 2006/0217082 A1 | 9/2006 | Fischer | |
| 2008/0107093 A1 | 5/2008 | Meiyappan et al. | |
| 2008/0122723 A1 | 5/2008 | Rofougaran | |
| 2009/0096517 A1 | 4/2009 | Huang et al. | |
| 2009/0231220 A1 | 9/2009 | Zhang et al. | |
| 2009/0267851 A1 | 10/2009 | Morris, III | |
| 2010/0053018 A1 | 3/2010 | Rofougaran | |
| 2010/0225543 A1 | 9/2010 | Kakitsu et al. | |
| 2012/0169565 A1 | 7/2012 | Morris, III | |
| 2013/0165067 A1 | 6/2013 | Devries et al. | |

OTHER PUBLICATIONS

Nishio et al., "A Study of Wideband Built-In Antenna Using RF-MEMS Variable Capacitor for Digital Terrestrial Broadcasting," Antennas and Propag. Soc. Int'l Symposium 206, IEEE Jan. 1, 2006—ISBN: 978-1-4244-0123-9, pp. 3043-3046.
Non-Final Office Action for U.S. Appl. No. 12/431,373 dated Aug. 3, 2011.
European Search Report/Office Action for EP Appl. No. 09739590.9 dated Nov. 7, 2011.
Final Office Action for U.S. Appl. No. 12/431,373 dated Feb. 9, 2012.
International Search Report and Written Opinion for PCT/US2011/049410 dated Feb. 21, 2012.
Non-Final Office Action for U.S. Appl. No. 12/431,373 dated Oct. 2, 2012.
Chinese Office Action for Application No. 200980113013.7 dated Dec. 5, 2012.
Final Office Action for U.S. Appl. No. 12/431,373 dated Feb. 15, 2013.
Advisory Action for U.S. Appl. No. 12/431,373 dated Apr. 25, 2013.
Restriction Requirement for U.S. Appl. No. 13/219,343 dated Jul. 15, 2013.
Chinese Office Action for Application No. 2009801130137 dated Aug. 2, 2013.
Notice of Allowance for U.S. Appl. No. 13/219,343 dated Sep. 5, 2013.
Non-Final Office Action for U.S. Appl. No. 12/431,373 dated Sep. 26, 2013.
International Search Report and Written Opinion for PCT/US2011/064459 dated Aug. 22, 2012.
Notice of Publication for PCT/US/2011/064459 dated Jun. 14, 2012.

* cited by examiner

MEMS TUNABLE NOTCH FILTER FREQUENCY AUTOMATIC CONTROL LOOP SYSTEMS AND METHODS

PRIORITY CLAIM

The present application claims the benefit of and priority to U.S. Provisional Patent Application Ser. No. 61/459,303, filed Dec. 10, 2010, the disclosure of which is incorporated herein by reference in its entirety.

TECHNICAL FIELD

The subject matter disclosed herein relates generally to electronic filters. More particularly, the subject matter disclosed herein relates to notch filters, for example such as those for use in a mobile phone.

BACKGROUND

In a frequency division duplex (FDD) wireless transceiver, such as CDMA and WCDMA, the transmitter and receiver sections of a mobile station need to operate simultaneously. A typical RF FDD front-end single-band block diagram of the wireless transceiver is shown for example in FIG. 1.

The duplexer in the RF front-end is used to separate the transmission and reception signals. The duplexer specification requirements on suppressing unwanted signal and/or interference are very high. Typically 55 dB or greater of isolation is required to suppress the transmission signal leaking into the receiver and a minimum 45 dB is required to suppress the transmitter noise in the receiver frequency band. Excessive transmission leakage through the duplexer to the receiver will cause inter-modulation and/or cross-modulation interference desensitizing the receiver. An external SAW filter with modest rejection level (typically 20 dB) is often placed after the LNA to relax the mixer linearity and duplexer rejection requirements. However SAW filters historically have shown resistance to integration and frequency tunability, thus increasing the size, component count, and cost of the overall transceiver.

In order to address these problems, tunable solutions such as YIG filters have been proposed. These filters exhibit low loss and broad tuning bandwidth characteristics, but they require an externally applied magneto-static field, suffer from slow tuning times due to hysteresis effects, and exhibit high power consumption.

Other options include distributed filter designs using coupled sections of resonant printed structures such as loaded combine filters, loaded loop resonators, or interdigitated filters. However, the large footprint required by these designs becomes the main disadvantage for any distributed implementation when designed for operation at typical cell phone frequency bands (700 MHz-2.7 GHz). In general, either acoustic or tunable lumped element filters must be used to meet cell phone real estate constraints. A non-tunable notch filter using bond wire inductors operating at the IMT band (TX: 1.92-1.98 GHz, RX: 2.11-2.17 GHz) has been developed, but low suppression level (approx. 12 dB) and high insertion losses (3 dB) can be measured with such a system. In addition, due to the non-tunable nature of the design, the suppression level shows high variation within in the operating frequency band.

In the cellular systems, the mobile phone operation frequency is channelized. The channel frequency spacing is only 100 kHz to 200 kHz depending on systems. Thus, the narrow band notch filter frequency needs to have frequency accuracy within 100 kHz for 2.5G and 3G mobile stations (channel spacing is 200 kHz) or 50 kHz for the LTE mobile stations (channel spacing 100 KHz). The frequency accuracy of the notch filter in this kind of application needs to be about $10^{-5}$ at least if the effective bandwidth of the filter is narrow down to the extent close to the signal bandwidth. The accuracy of the components comprising the notch filter is only 1%. In this case, it is impractical for an individual notch filter to utilize a fixed lookup table for filter tracking the transceiver operation frequencies. Accordingly, it would be desirable for a tunable filter to be able to dynamically track transceiver operation.

SUMMARY

In accordance with this disclosure, tunable notch filters, such as micro-electro-mechanical systems (MEMS) tunable notch filters, and control loop systems and methods are provided. In one aspect, a tunable filter and control system is provided. The tunable filter and control system can comprise a tunable notch filter providing a stop band, a sensing circuit in communication with the tunable notch filter and adapted to determine a phase change between a reference signal and a signal reflected from the tunable notch filter, and a control loop in communication with the tunable notch filter and the sensing circuit, the control loop being operable to adjust the tunable notch filter to modify the phase change.

In another aspect, a method for rejecting the strongest signal on an input of a tunable filter and control system can comprise receiving a reference signal at a tunable notch filter, wherein at least a portion of the reference signal is reflected by the tunable notch filter, sensing a phase change between the reference signal and the signal reflected from the tunable notch filter, and adjusting the tunable notch filter to modify the phase change.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

A tunable narrow band notch filter may be used in the front-end of mobile phone receivers to deeply suppress the counterpart transmitter power leakage into the receiver. It may also be used in other RF applications wherever an interfering signal must be suppressed. In the cellular systems, the operation frequency of mobile phone transceivers is switched when its communication with one base station handovers to another base station. The present subject matter provides filter frequency control loops and methods for automatically tuning the notch filter center frequency to track the mobile phone transceiver operation frequency switch as well as compensating for manufacturing tolerances and operational variations such as may result, for example, across a range of ambient temperatures. The frequency control loop can utilize the phase of the transmitter local oscillator (LO) frequency or directly use the transmitter leakage as the reference and detect if the phase of the reflected LO or transmitter leakage signal from the notch filter has changed or not. Based on the phase change of the reflected LO or transmitter leakage, the frequency control loop can pull the notch filter center frequency equal to the current transmitter operation frequency. Thus, the leaking power from the transmitter into the receiver can be effectively suppressed no matter what frequency the transceiver operates on. Alternatively, the tunable notch filter can be used in other systems to reject whatever the strongest signal on its input may be to protect downstream circuitry.

Figure 1:
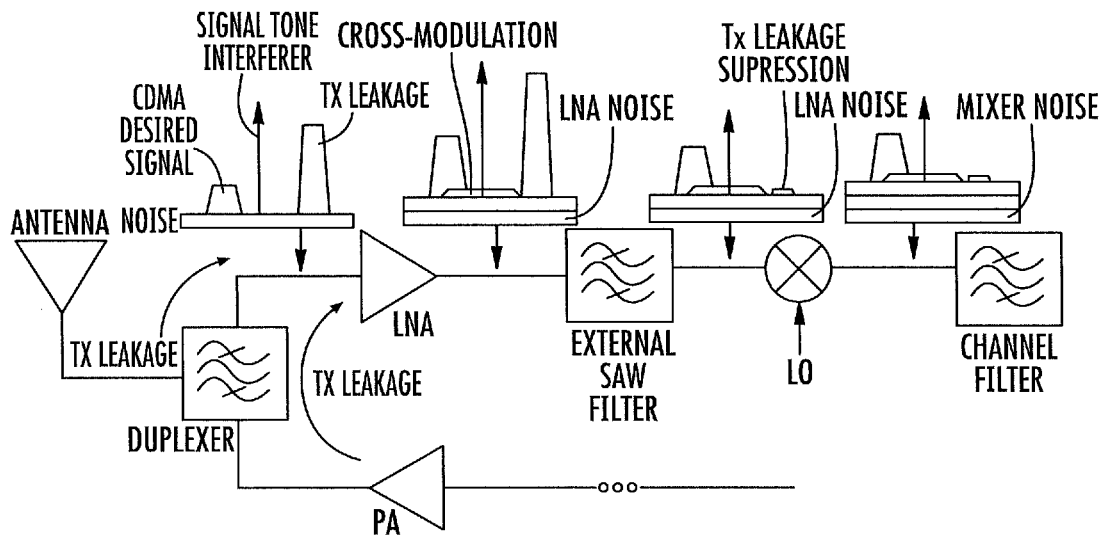
FIG. 1 is a RF front-end block diagram of CDMA/WCDMA mobile transceivers according to a conventional, prior art system configuration.
Figure 2:
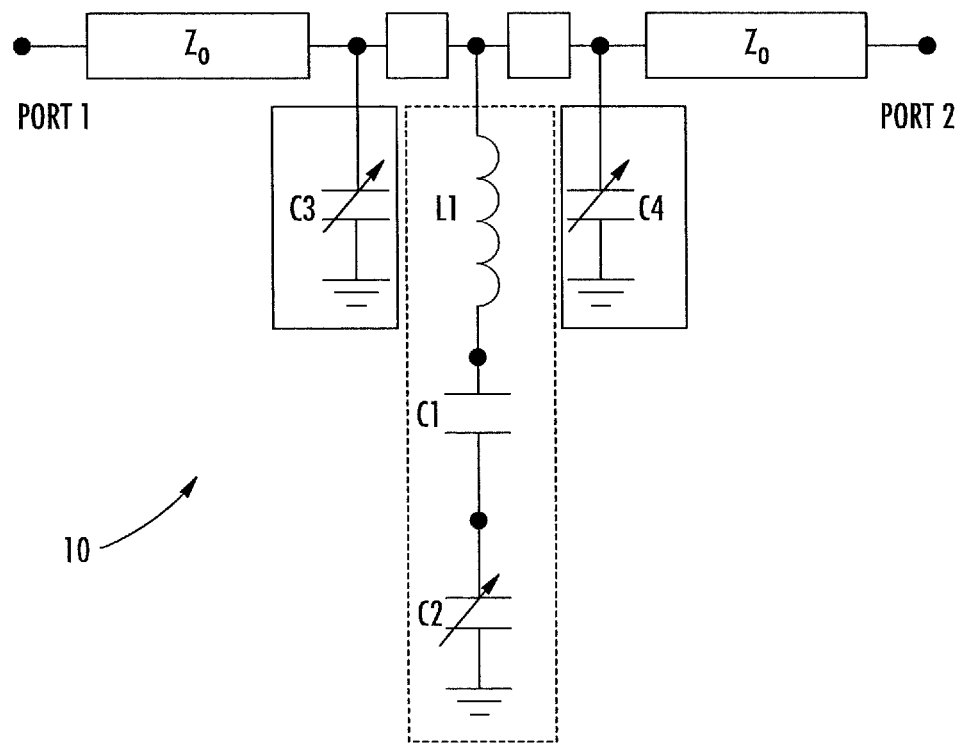
FIG. 2 is a circuit schematic of the fabricated SPSZ tunable filter design according to an embodiment of the presently disclosed subject matter.

In practical notch filter designs, a single bandpass is usually designed to coexist near the notch frequency. When this is the case, the design is also referred as single-pole, single-zero filter denoting a unique pole and zero in the filter transfer function. A configuration for a tunable notch filter circuit using tunable components, generally designated 10, is shown in FIG. 2. The notch filter can comprise a series-LC resonator (See, e.g., first capacitor C1 having a first capacitance $C_1$, second capacitor C2 having a second capacitance $C_2$, and inductor L1 having an inductance $L_1$ shown in the dashed box in FIG. 2) providing the signal notch or rejection at a transmitter frequency, and two shunt capacitors (e.g., third capacitor C3 having a third capacitance $C_3$ and fourth capacitor C4 having a fourth capacitance $C_4$) that combine with the excess reactance of the series-LC resonator to form a low loss passband at the corresponding receiving frequency. This topology can allow for the notch filter suppression and the bandpass filter insertion loss to be tuned separately. All the tunable capacitors used in this filter can for example be RF microelectro-mechanical (MEMS) capacitors.

The series-LC block can resonate at a notch frequency that can be represented as follows:

$$\omega_r = \frac{1}{\sqrt{L_1 C_r}} \tag{1}$$

where $C_r$ represents the resonator composite capacitance resulting from the series connection of first and second capacitances $C_1$ and $C_2$ and can be expressed as follows:

$$C_r = \frac{C_1 C_2}{C_1 + C_2} \tag{2}$$

At resonance ($f_r$), the series-LC block can present a short circuit to ground reflecting most of the signal traveling along the transmission line. The values of $L_1$ and $C_1$ can be chosen in order to obtain a resonance frequency higher than 1.98 GHz when all MEMS capacitor cells used in capacitor C2 are in the "Off" state (i.e., minimum capacitance). By tuning the value of $C_2$, the resonance frequency can be dynamically adjusted to generate a notch at one of the transmitter operating frequencies. The center frequency of this notch filter should be capable of being tuned to cover the entire IMT transmission frequency band (from 1.92 to 1.98 GHz).

On the other hand, the bandpass filter comprises the series-LC block in combination with third and fourth capacitors C3 and C4 that are located in a symmetrical fashion on both sides of the resonator. This arrangement minimizes the insertion loss of bandpass filtering and makes impedance matching identical as seen from ports 1 and 2.

The total capacitance $C_\|$ of capacitances $C_3$ plus $C_4$ for resonating at the receiver frequency $\omega_{rx}$ can be obtained from Equation (3) below:

$$C_\| = \frac{1}{\omega_{rx}^2 L_1 - \frac{1}{c_r}} \tag{3}$$

The S-parameters for the notch and bandpass combination filter can be derived and expressed as follows:

$$S_{11} = \frac{-\omega_r(2C_3\omega_r^2 L_1 C_1 C_2 - 2C_3 C_2 - 2C_3 C_1 - C_1 C_2)Z_o}{\beta} \tag{4}$$

$$S_{21} = \frac{-2j(\omega_r^2 L_1 C_1 C_2 - C_2 - C_1)}{\beta} \tag{5}$$

where $$\beta = (2j\omega_r^2 L_1 C_1 C_2 + 2jC_2 + 2jC_1 + \\ 2\omega_r^3 Z_o C_3 L_1 C_1 C_2 - 2\omega_r Z_o C_3 C_{32} - 2\omega_r Z_o C_3 c_1 - \omega_r Z_o C_1 C_2) \tag{6}$$

where $Z_o$ is a reference impedance (e.g., about 50Ω). It is expected that $S_{11}=S_{22}$ (symmetric matching condition) only if the capacitance values $c_3$ and $c_4$ are identical.

Notch filter 10 described above provides an inherent narrow rejection bandwidth. The filter center notch frequency can be tuned with an accuracy of 100 kHz or less for 2.5G and 3G mobile systems (channel spacing is 200 kHz) or 50 kHz or less for the LTE system (channel spacing 100 KHz).

To achieve the accurate frequency tuning of the narrow band notch filter, a frequency automatic control loop can be provided. Such a loop can utilize the transmitter carrier as a reference signal and uses the reflection phase change of the reference signal from the notch filter to tune the filter frequency and to track the channel frequency that the mobile station transmitter operates on.

Figure 3A:
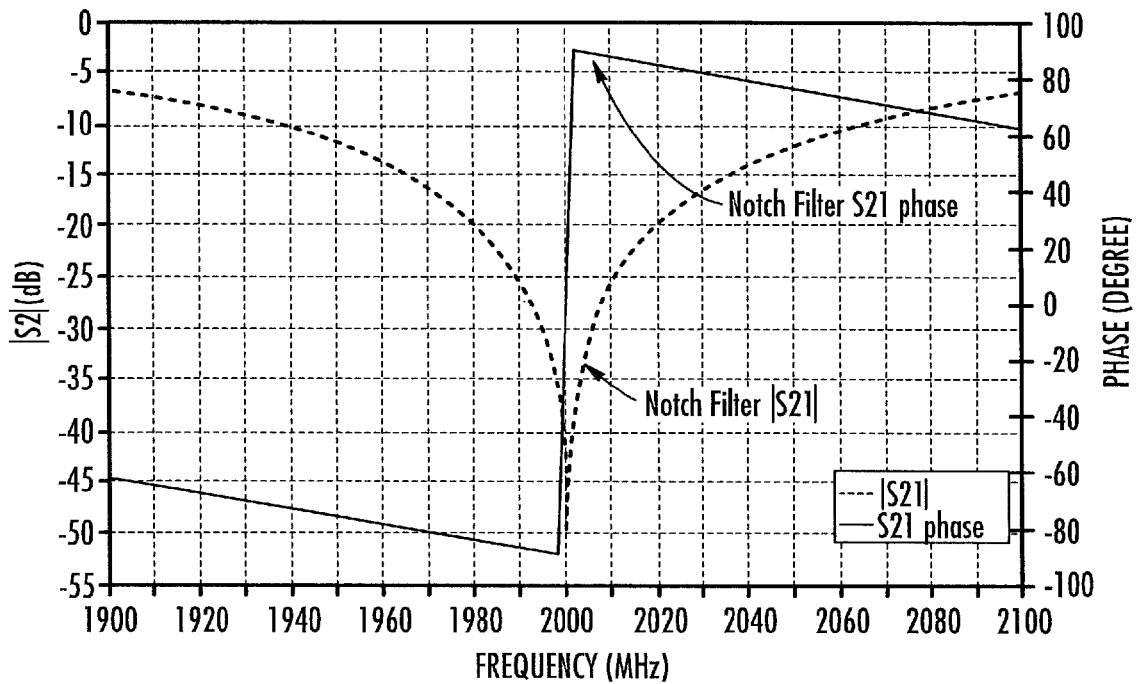
FIG. 3a is a graph illustrating frequency responses of an ideal LC notch filter $S_{21}$ magnitude and phase.

It is noted that a frequency automatic control loop for MMIC bandpass filters has been developed previously. Unlike the conventional bandpass filter frequency control loop using the transmission coefficient ($S_{21}$) phase and/or magnitude, however, a frequency control loop according to the present subject matter can uniquely utilize the filter reflection coefficient ($S_{11}$) phase information. In addition, one key difference from conventional bandpass filters is that the signal passing through the present notch filter can be suppressed to a very weak level which may be difficult to detect. Additionally, the notch filter can present 180° phase jump in transmission at its notch (or center) frequency (See, e.g., FIG. 3a). As a consequence, the transmission phase information can be difficult to utilize for the frequency control loop to tune the filter frequency.

Figure 3B:
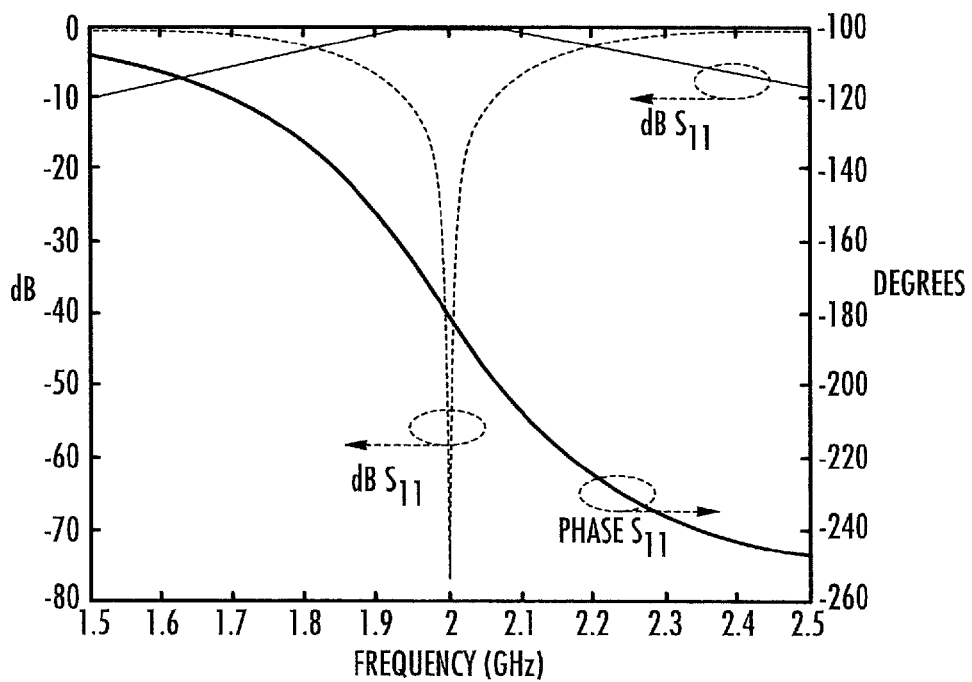
FIG. 3b is a graph illustrating frequency responses of an ideal LC notch filter $S_{11}$ magnitude and phase.

In the case of notch or other narrowband rejection filters, the phase information of the reflected reference signal from the filter (i.e., the phase information of the $S_{11}$ around the notch frequency) can be used for tuning. An advantage of sensing $S_{11}$ is that the magnitude of the reflection coefficient of the notch filter near its notch frequency is very high. In addition, the $S_{11}$ reflection phase behavior versus frequency is continuous across its notch frequency and in quasi linear fashion as shown in FIG. 3b.

However, the phase of the notch filter reflection coefficient $S_{11}$ monotonically varies with the frequency change and it crosses the 0° at the center frequency of the notch filter. This can be mathematically described by the transfer function of a simple notch filter reflection coefficient, $H_{S11}(j\omega)$:

$$H_{S11}(j\omega) = \frac{-k(\omega(t)/\omega_0)}{\sqrt{(1-\omega^2(t)/\omega^2)^2 + k^2\omega^2(t)/\omega_0^2}} \exp(\angle H_{S11}) \quad (7)$$

where the $S_{11}$ phase is expressed as $$\angle H_{S11} = \arctg \frac{1-\omega^2(t)/\omega^2}{k\omega(t)/\omega_0} \quad (8)$$

where $\omega$ is the angle frequency equal to $2\pi f$ (f is frequency), $\omega_o$ is the notch filter center angle frequency, and k is a coefficient associated with filter Q factor under 50 ohm load. Utilizing the phase monotone variation with the frequency and the $S_{11}$ phase equal to zero degree at the center frequency $\omega=\omega_o$, the notch filter frequency automatic tuning and tracking can be achieved by using a phase locked loop.

Figure 4:
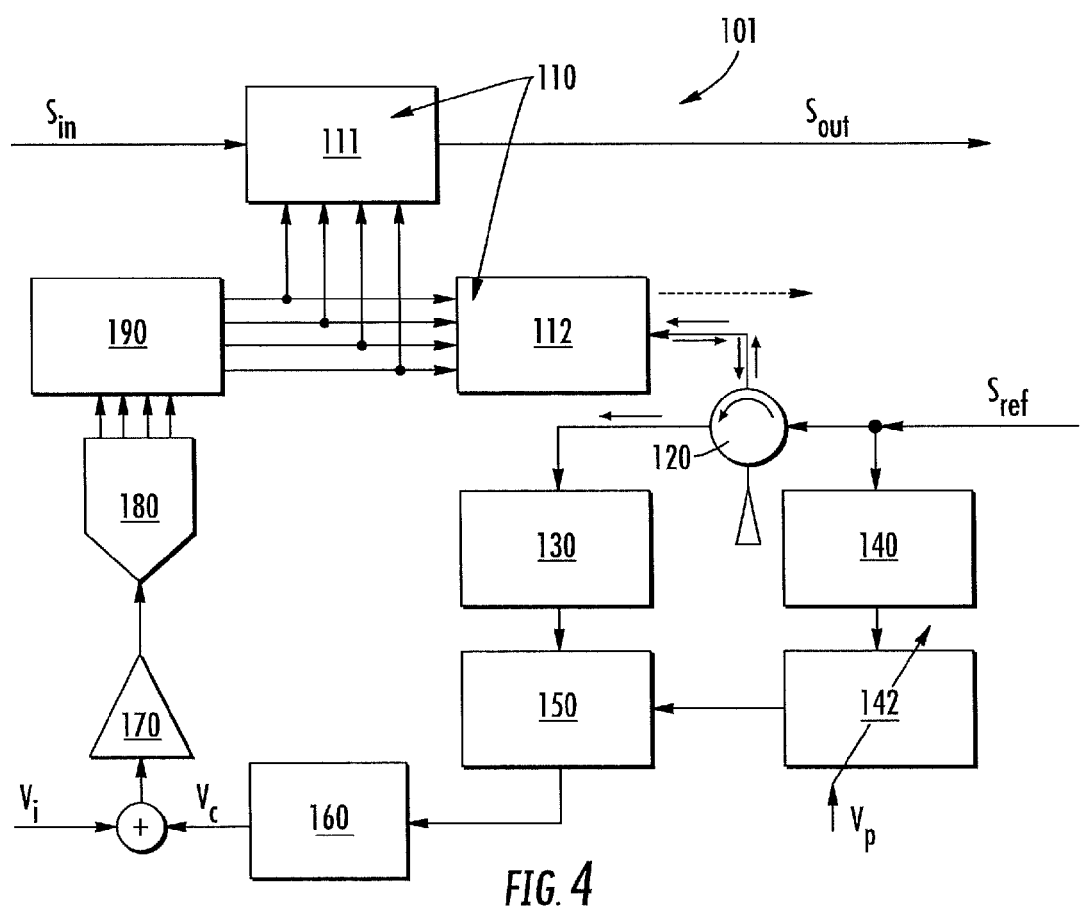
FIG. 4 is a block diagram of a narrow band notch filter frequency control loop according to an embodiment of the presently disclosed subject matter.

A first notch filter frequency control loop configuration, generally designated 101, is depicted in FIG. 4. First notch filter frequency control loop configuration 101 can comprise a tunable notch filter 110 that can comprise a first notch filter section 111 configured to receive an input RF signal $S_{in}$ and a second notch filter section 112 in communication with a sensing circuit adapted to determine a phase change between a reference signal and a signal reflected from tunable notch filter 110. In particular, a sensing circuit in first notch filter frequency control loop configuration 101 can comprise a circulator 120 that is configured to receive a reference RF signal $S_{ref}$. For example, reference RF signal $S_{ref}$ can be the transmitter LO signal. Reference RF signal $S_{ref}$ can be split into two by a power divider, with one path passing through circulator 120 towards second notch filter section 112. Second notch filter section 112 can reflect most of the power of reference RF signal $S_{ref}$ back to circulator 120, where the reflected signal can be routed to a first RF LOG amplifier 130. The amplified reflected signal can then being routed to a phase detector 150.

The second path from the power divider can direct reference RF signal $S_{ref}$ to a second RF LOG amplifier 140, from which an amplified reference signal can be passed to a voltage control phase shifter 142. The signal coming out from phase shifter 142 can have a right phase difference from the phase of the signal reflected by second notch filter section 112 (e.g., a 90° phase difference) to make phase detector 150 operate in its linear region and provide the highest gain. This signal from phase shifter 142 can also be input to phase detector 150 as a reference to detect the phase change of the signal reflected by second notch filter section 112. A phase control voltage $V_p$ can be used for dynamically adjusting phase shifter 142 with the channel frequency switch to account for the phase difference caused by the two paths to the inputs of phase detector 150 having different physical lengths.

In the case that the frequency of the signal received at phase detector 150 from first RF LOG amplifier 130 is different from the current filter center frequency, the output voltage of the phase detector 150 can vary proportionally to the detected phase change of signal reflected by second notch filter section 112. This output can be provided to a control loop operable to adjust tunable notch filter 110 to modify the phase change. In particular, the voltage variation produced by phase detector 150 can be filtered by a low-pass filter 160 to produce a filtered voltage signal $V_c$. An initial voltage $V_i$ can be added to filtered voltage signal $V_c$ to initially set the notch filter rough center frequency based on the transceiver operation channel frequency information. This initially voltage $V_i$ can broaden the frequency control loop phase locking operation range, speeding up the locking time, and reducing the frequency control error.

The filtered voltage signal $V_c$ can be fed to a buffer amplifier 170 having a gain Kc and routed to an analog to digital (ADC) converter 180, where the voltage control signal can be converted to digital bits. A coder 190 can translate the bit sequence into tuning words, and tunable notch filter 110 can be tuned to the new frequency, thereby producing an output RF signal $S_{out}$.

Figure 5:
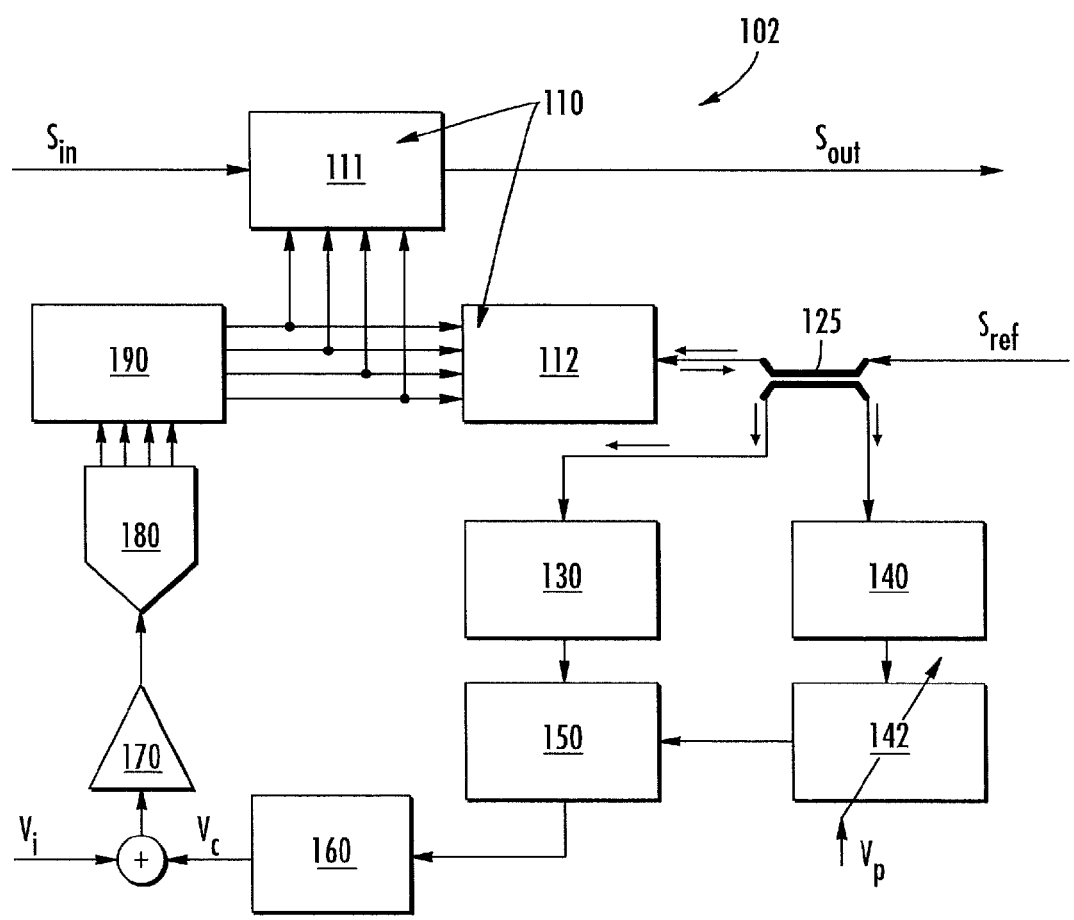
FIG. 5 is a block diagram of a narrow band notch filter frequency control loop according to an embodiment of the presently disclosed subject matter.

In an alternative configuration shown in FIG. 5, for an integrated circuit implementation, the sensing circuit of a second notch filter frequency control loop configuration 102 can comprise a lumped element directional coupler 125 or a circuit device with a similar function in place of circulator 120 shown in the configuration of FIG. 4. In this configuration, directional coupler 125 can split reference RF signal $S_{ref}$ for passage to both of second notch filter section 112 and second RF LOG amplifier 140. Otherwise, second notch filter frequency control loop configuration 102 can operated in much the same way as first notch filter frequency control loop configuration 101 discussed above. In either first or second notch filter frequency control loop configuration 101 or 102, any type of transmitter signals can be processed, such as single carrier and multiple carrier (OFDM) signals.

Figure 6:
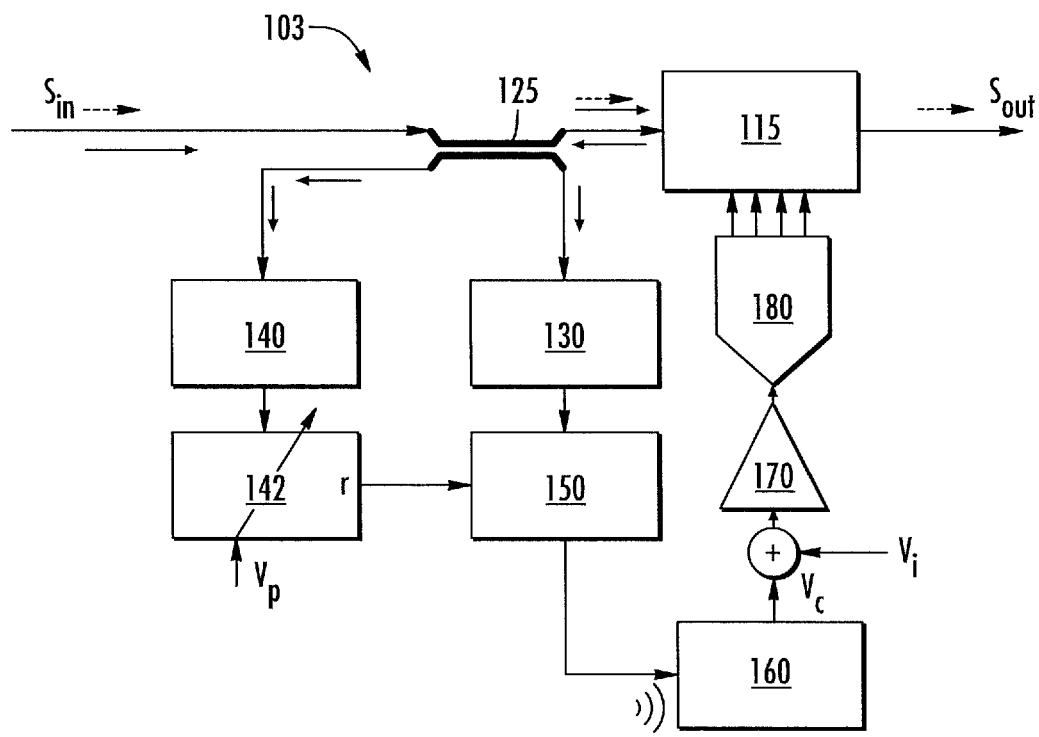
FIG. 6 is a block diagram of a narrow band notch filter frequency control loop according to an embodiment of the presently disclosed subject matter for use with a single carrier transmitter signal.

In yet another alternative configuration for the case of the transmitter signal being single carrier, a third notch filter frequency control loop configuration 103 can be comparatively simplified and built on the main filter itself as depicted in FIG. 6. In this arrangement, the transmitter leakage signal contained in input RF signal $S_{in}$ can be used directly as a reference signal. For example, directional coupler 125 can be positioned in-line between the source of input RF signal $S_{in}$ and a stand-alone tunable notch filter 115. In this way, input RF signal $S_{in}$ can be provided to directional coupler 125, which takes part of the forward transmitter leakage power as the reference signal of the frequency control loop. This coupled forward transmitter leakage signal can be amplified by second RF LOG amplifier 140 to remove all the AM modulation from the signal. After this amplified and AM-removed transmitter leakage signal has a phase properly adjusted at a phase shifter 142, it can be input to phase detector 150.

In a second path, the forward transmitter leakage signal then hits stand-alone tunable notch filter 115, and it can be mostly reflected by stand-alone tunable notch filter 115, having a phase change $\Delta\phi$ that is different from 180° if the leakage signal carrier frequency $\omega_r$ is different from the notch filter originally tuned frequency $\omega_o$. The reflected transmitter leakage signal can be coupled to a branch of directional coupler 125 in communication with first RF LOG amplifier 130. This reflected transmitter leakage signal can also be amplified by first RF LOG amplifier 130 to remove its AM modulation as can be done for the reference leakage signal. The amplified reflected transmitter leakage signal can then be routed to anther input of phase detector 150. Phase shifter 150 can adjust the initial phase difference between the two input signals to 90°.

The output from phase detector 150 can be a voltage $V_c$ that depends upon the reflection coefficient phase of the notch filter according to the following relationship:

$$V_C \sim A_o^2 \sin(\angle H_{S11}(\omega)) \qquad (9)$$

The high frequency products are filtered by a low-pass RC loop filter 160. Then, as in the other configurations, only the low frequency output passes through lowpass filter 160, and it can be amplified (e.g., at buffer amplifier 170) and digitized (e.g., at ADC converter 180) before being provided to tune the MEMS capacitors in stand-alone tunable notch filter 115 and make the frequency of stand-alone tunable notch filter 115 align with the leakage carrier frequency $\omega_r$.

In any of the configurations described above, the narrow band MEMS notch filter can be used to automatically and precisely tune mobile phone transceivers by using a frequency automatic control loop according to the presently-disclosed subject matter. Thus, the notch filter center frequency can accurately track the channel frequency on which the mobile phone transceivers operate.

Figure 7:
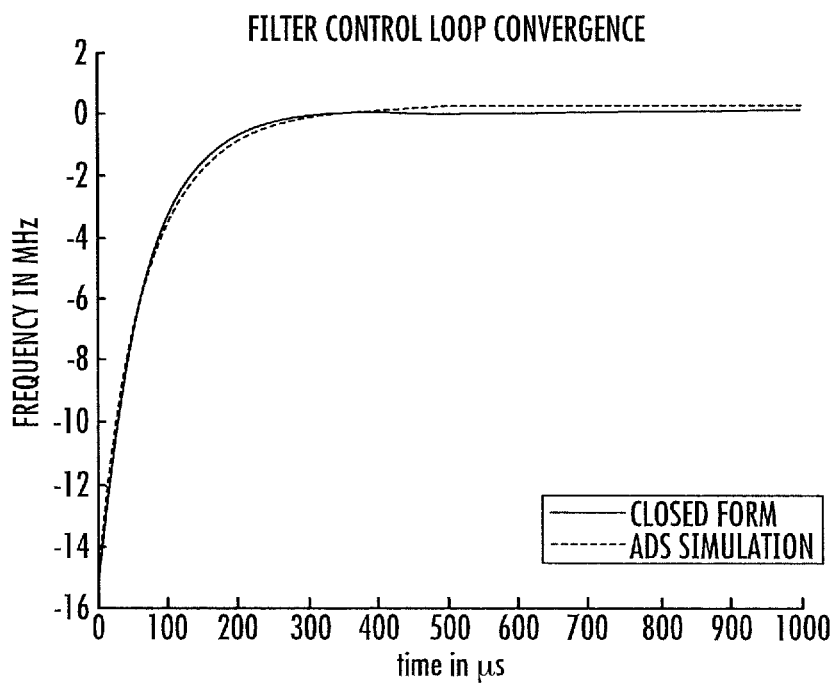
FIG. 7 is a graph illustrating a comparison of closed form expressions and ADS simulations for a second order filter response.

Using a tunable notch filter frequency control loop, such as a system having one of those configurations discussed above, a number of advantageous performance improvements can be achieved. For example, the notch filter frequency control loop performance can compare favorably to ADS simulations. Specifically, a notch filter having one of the configurations discussed above can be implemented by using a fixed value of inductance $L_1$=10.6 nH and $C_r$=0.6 pF, which can produce a notch frequency at 2 GHz. When $\omega_c$=20 KHz, $Q_o$=1000 and $\tau$=0 µs, the transient responses of this frequency control to an initial frequency offset $\Delta\omega_o$=15 MHz and ADS simulations are shown in FIG. 7. As can be seen from this comparison, good agreement of the results obtained from both approaches can be observed.

Figure 8:
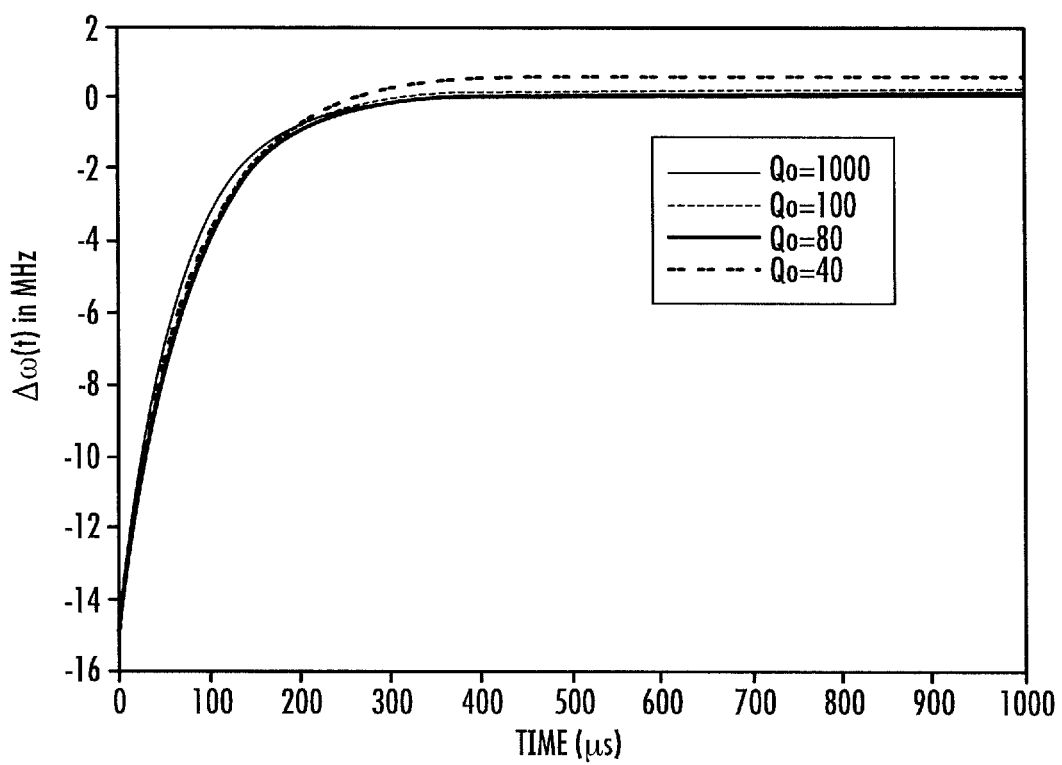
FIG. 8 is a graph Illustrating simulated filter frequency control loop transient response for different $Q_0$ values.

Using the same loop parameters as above, the locking time responses for the filter $Q_o$=1000, 100, 80 and 40 are shown in FIG. 8. All responses have similar exponential behavior but the final frequency error decreases with an increase to $Q_o$. Table I shows the numerical final frequency error for all considered $Q_o$ values:

TABLE I

| $Q_o$ | Final Frequency Error (KHz) |
|---|---|
| 1000 | 11 |
| 100 | 87 |
| 80 | 148 |
| 40 | 627 |

Figure 9:
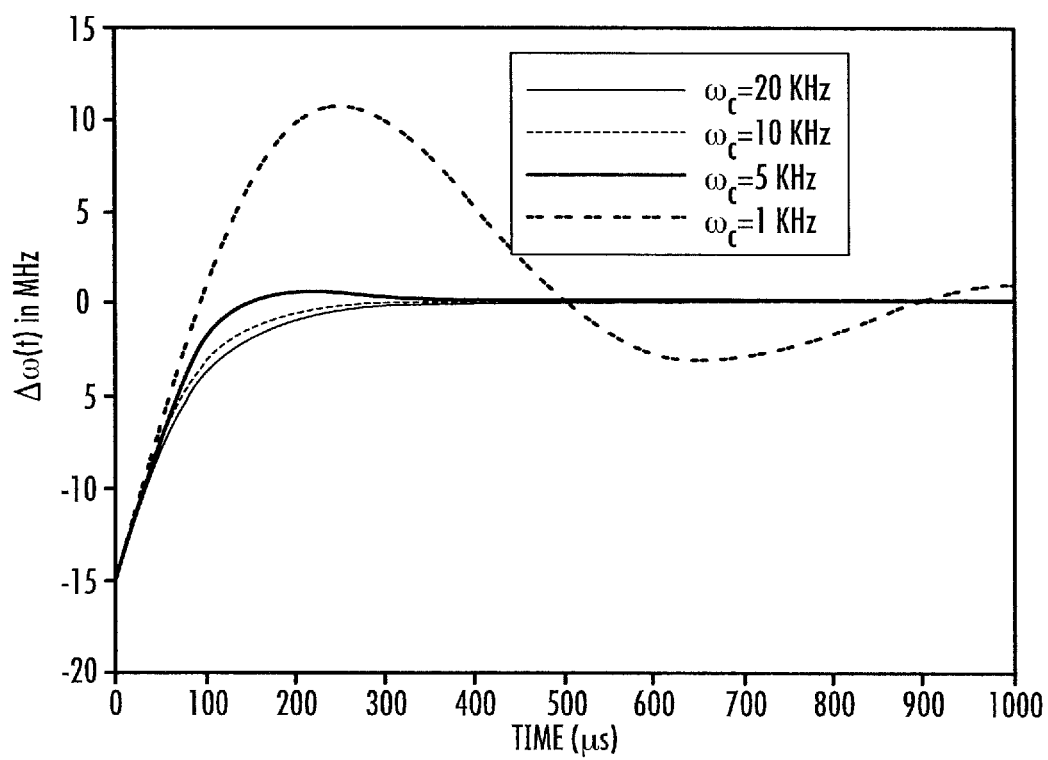
FIGS. 9 and 10 are graphs illustrating simulated filter frequency control loop transient response for different $\omega_c$ values.

The low pass filter cut off frequency $\omega_c$ or the loop bandwidth impacts the filter frequency locking time. The locking time responses for different $\omega_c$ and $Q_o$=80, A=0.12, $\Delta\omega_o$=15 MHz, and $\tau$=0 are shown in FIG. 9. Small $\omega_c$ values create damped oscillations in the transient responses and therefore, longer frequency locking times. To achieve a shorter frequency convergence time for this loop, for example, a cut-off frequency $\omega_c$=10~20 kHz can be selected.

Figure 10:
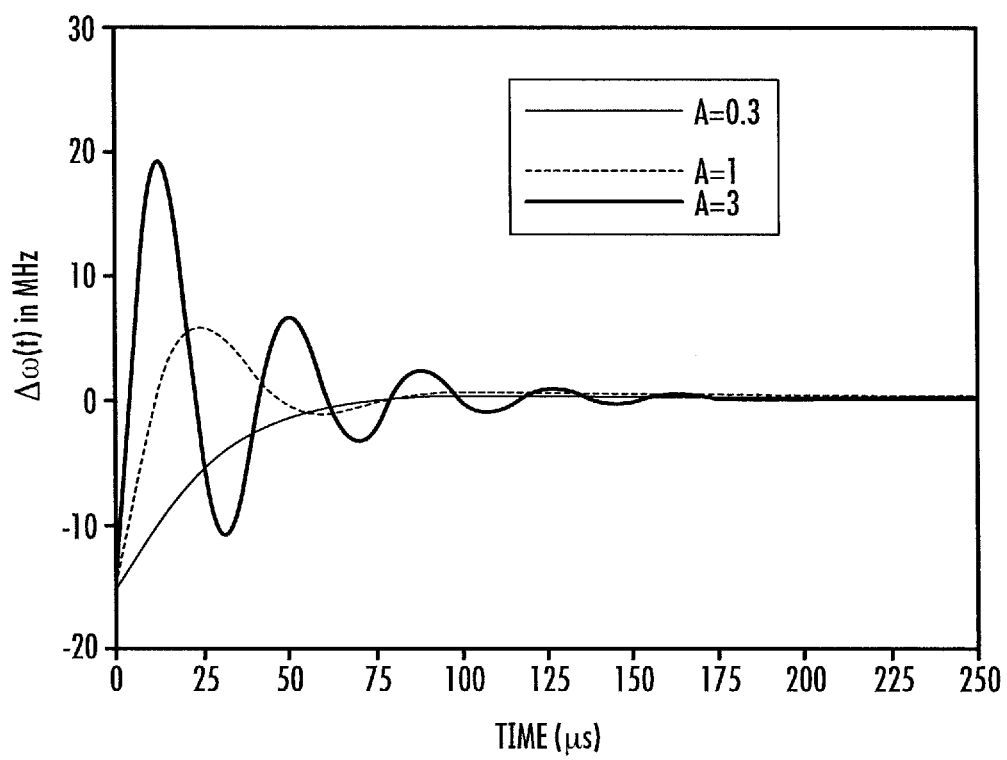

The overall loop gain (controlled by parameter 'A') impacts the locking time and oscillatory behavior. A high loop gain may cause frequency divergence situations. FIG. 10 shows the filter frequency control error transient response for different values of 'A'. The number of oscillations and locking time increases with an increasing gain. It was found that a gain value higher than A>4.1 can result in a divergent situation. Due to the loop gain importance, good care must be given not to exceed the convergence threshold during the control loop design.

Figure 11:
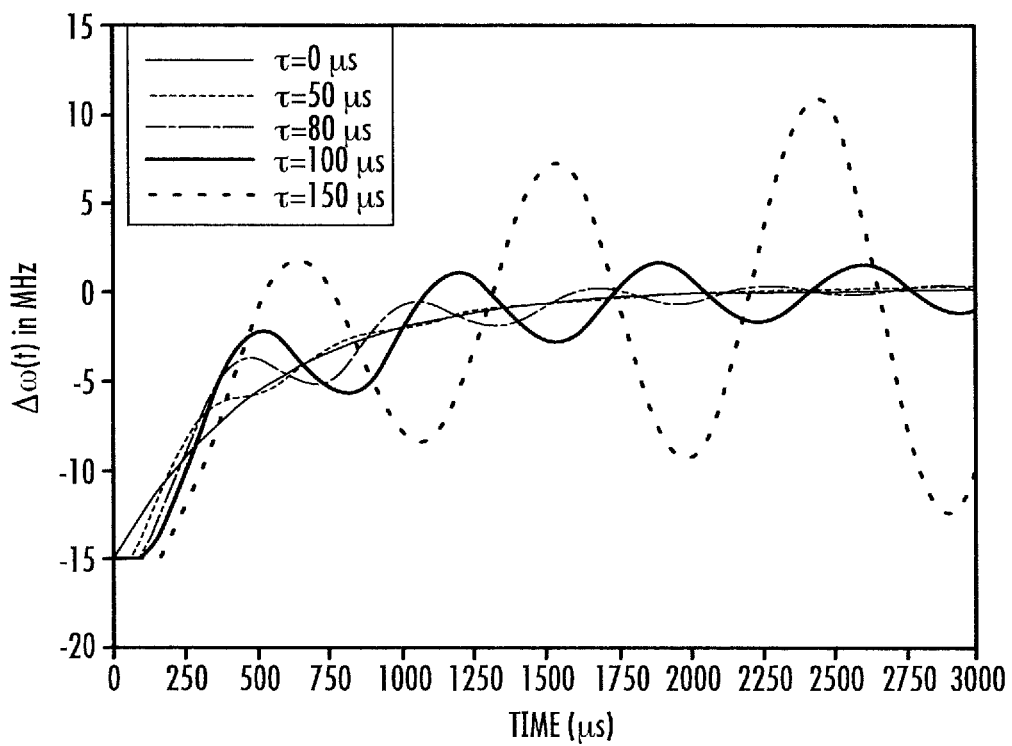
FIG. 11 is a graph illustrating simulated filter frequency control loop transient response for different $\tau$ values.

The capacitor actuation delay time can also affect the frequency locking time of the filter and may possibly cause a divergent solution. The filter frequency control error transient response for different MEMS capacitor actuation delays is shown in FIG. 11. The time scale has been expanded to 3 ms in order to observe convergence. For the delay times larger than 150 µs, the filter frequency control loop can become unstable and the frequency divergent. It is thus important to choose the overall loop gain in consonance with the actuation delay time to make the loop operate in convergent region. A low loop gain can be chosen for large actuation delays. In this case, the price of achieving the convergence is a longer locking time.

Implememntations and Measurements

A standalone tunable filter according to the present subject matter can comprise an existing high Q tunable digital capacitor array (TDCA) flip chip solution. The TDCA can consist of a plurality of tunable capacitor cells (e.g., twenty cells) of nominal value of about 1 pF or 0.875 pF. The minimum capacitance step resolution of each cell can be about 0.125 pF. The cells in the TDCA can be interconnected on the PCB level in order to achieve any desired topology.

The Q of the die level capacitors can be measured to be greater than 150 at 2 GHz, allowing low insertion loss designs. In addition, the value of capacitance is highly repeatable, which is an important feature for narrowband tunable filtering circuits. The IP3 level for such a device can be about 65 dBm, and the group delay distortion can be below 1 ns in the received signal pass band. The CMOS biasing circuitry can be integrated in the same chip and can transform a 3.3V supply voltage to the required 35V voltage actuation level. The power consumption can be about 6 µA and 90 µA in the sleep and the active mode (i.e., charge pump on), respectively. A Serial Peripheral Interface (SPI) can be used to control the capacitor banks states. A USB port can be used to transmit the tuning commands from PC control software. The software can require very low computational effort and can be easily implemented on a cell phone microprocessor.

Figure 12:
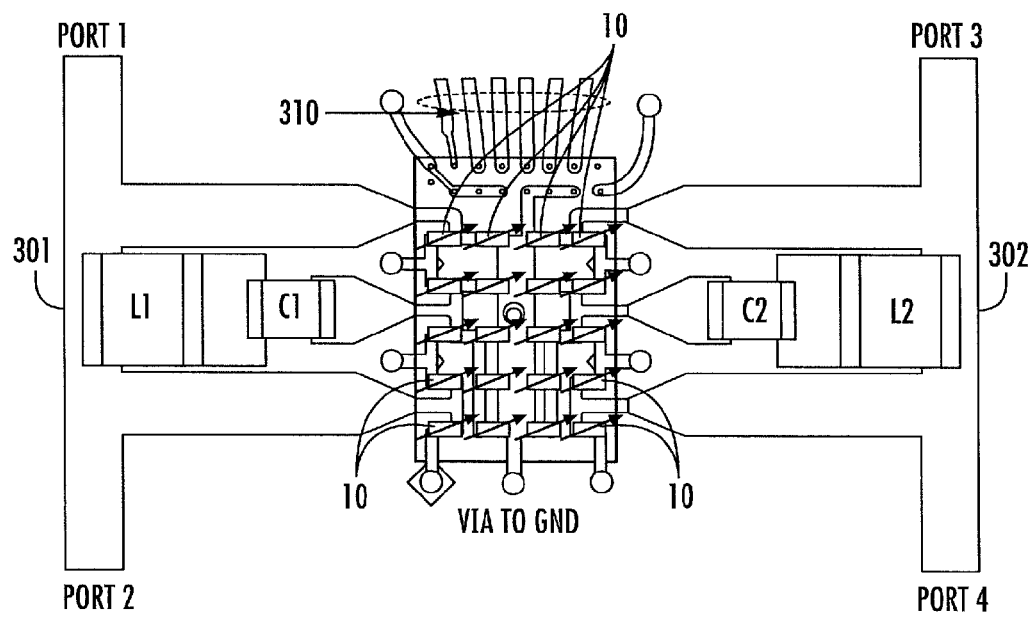
FIG. 12 is schematic diagram showing a tunable digital capacitor array that integrates notch filter sections according to an embodiment of the presently disclosed subject matter.

As shown in FIG. 12, two identical filters 301 and 302 can be designed using a single TDCA die. The objective in such an arrangement can be to involve one of the filters in the control loop and replicate any action taken in the remaining filters that is used for monitoring and reproducibility testing purposes. In this regard, the system can comprise a plurality of tunable notch filter sections (e.g., each having a configuration of tunable notch filter 10 shown in FIG. 2) in combination with a plurality of bandpass sections arranged as shown between filters 301 and 302. FIG. 12 also provides information on how the cells can be interconnected underneath the chip showing that half of the TDCa cells where used for each filter.

The SPSZ filter shown in FIG. 2 can be fabricated using a 0.254 mm thick Rogers 4003C substrate ($\epsilon r$=3.55, tan $\delta$=0.0021 at 2.5 GHz) backed with 14 μm thick copper. The 50 ohms microstrip line width can be calculated to be about 0.58 mm for this substrate. A bottom layer of thick FR4 can be used for mechanical stability purposes and to allocate the control circuitry and SPI buffers. Side launch SMA connectors can be used to connect the structure to a VNA through 3.5 mm coaxial cables. The components used for the filter can be SMD 0402 Murata high Q multilayer ceramic capacitors and 0608 chip CoilCraft inductors.

Figure 13:
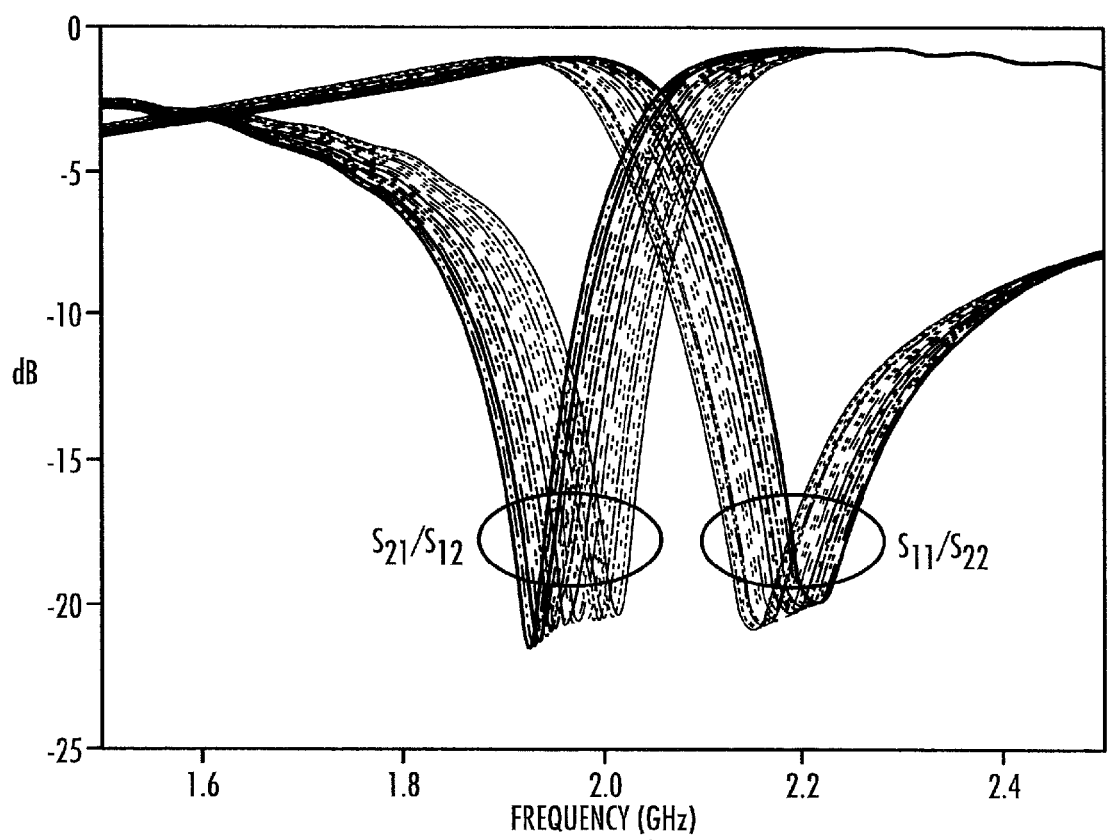
FIGS. 13 and 14 are graphs illustrating measurement results for transmission and return loss characteristics of a SPSZ tunable filter according to embodiments of the presently disclosed subject matter.

The measured transmission and return loss of the filter for 39 different tuning states of the resonator block are shown in FIG. 13. The measured suppression in the transmitter band is equal or higher than 22 dB within a 5 MHz bandwidth, and the insertion loss in the receiver band is less than 0.8 dB within the reception signal bandwidth. The return loss is better than 20 dB in the pass band on the receiver side. The suppression level is almost constant over the entire transmitter operating band as shown in FIG. 13 The filter tuning range is 90 MHz which covers the transmitter band (1920 MHz-1980 MHz) and the receive band (2110 MHz-2170 MHz).

Figure 14:
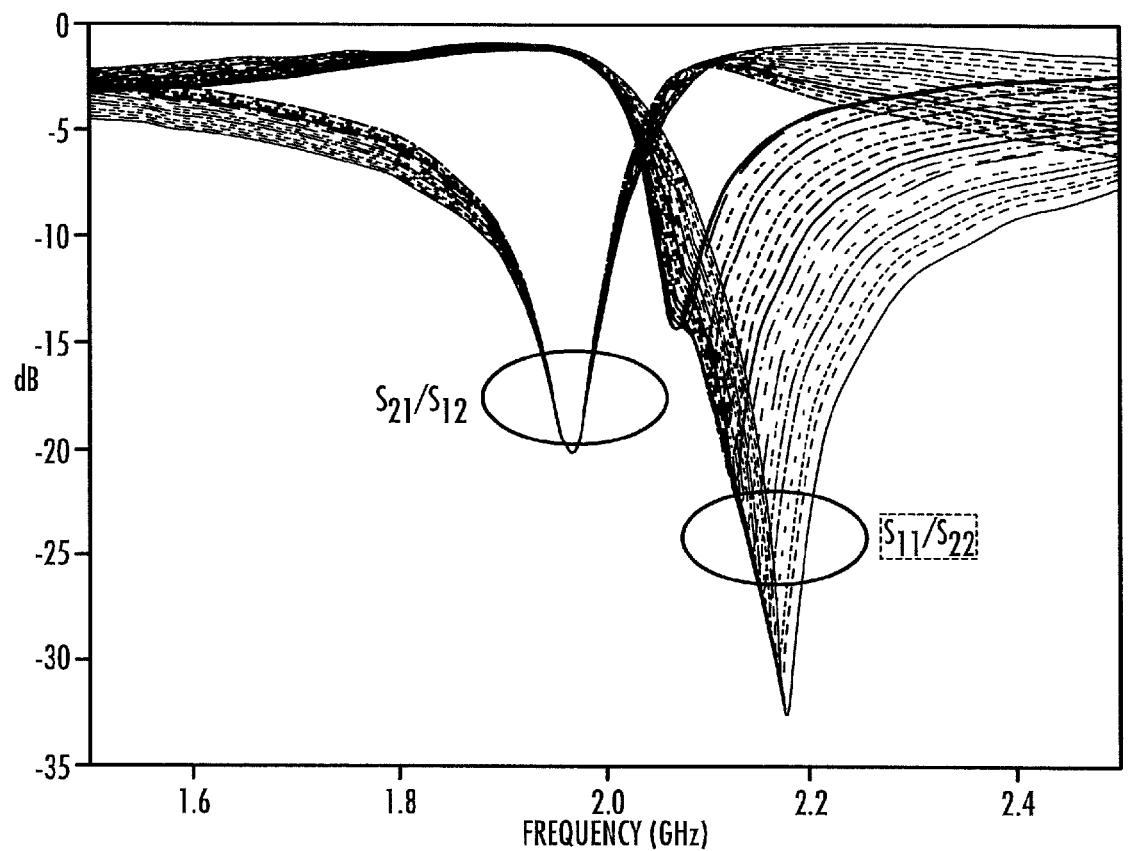

FIG. 14 shows the insertion and return loss tuning using banks of third and fourth capacitors C3 and C4 when second capacitor C2 is in the minimum capacitance state. As expected, this tuning does not affect the position of the resonator block resonant frequency. Therefore, this tuning capability can be used to compensate for changes in the insertion and return loss values as shown in while tuning the notch. Finally, Table II summarizes the suppression and insertion loss levels achieved by tuning the TDCA chip for the two limiting frequency pairs 1.92 GHz-2.11 GHz and 1.98 GHz-2.17 GHz.

TABLE 2

|  | IMT Band Lower Pair Tx: 1.92 GHz, Rx: 2.11 GHz | IMT Band Upper Pair Tx: 1.98 GHz, Rx: 2.17 GHz |
| --- | --- | --- |
| Tx Leakage Suppression | 22.1 dB | 21.3 dB |
| RX Insertion Loss | 0.8 dB | 0.7 dB |

Notch filter control loops such as those discussed above can likewise be implemented using discrete components. A 20 dB directional coupler (Meca 722S-20-1.950) can distribute the input and reflected leakage signals. An analog adjustable phase shifter (Narda 3752) can be used to provide the 90 degree phase difference at the phase detector input when the transmit leakage and notch frequency are aligned. The phase detector board can include logarithmic amplifiers and provide a single ended output with dynamic range between 0 and 2 volts. The integrator can be implemented using and operational amplifier (THS3091DDA). The low pass filter can be a single stage RC circuit with a cutoff frequency of $\omega_c$=20 KHz. The analog to digital convertor (ADC)-(NI USB-6009) can be used to convert the output voltage from the integrator into a digital signal. A PC can be used here as an encoder in order to generate the tuning words that actuate the tunable RF MEMS capacitors. The communication link between the PC and the TDCA die can be based on SPI commands sent via USB-SPI interface (Total Phase Cheetah). The left tunable filter ports can be connected to a vector network analyzer for monitoring purposes.

Due to the unknown delay associated with the ADC and PC processing speed, it can be difficult to accurately determine the fast filter locking response time. Therefore, in order to check the filter convergence the time axis is considered here as number of iterations (or tuning words) required for the filter to achieve the frequency tracking. The locking time can then be estimated by multiplying the number of iterations by the MEMS actuation delay (typically 10 μs with this technology). The final estimated value would be reasonably close to the expected locking time in an IC implementation.

Figure 15:
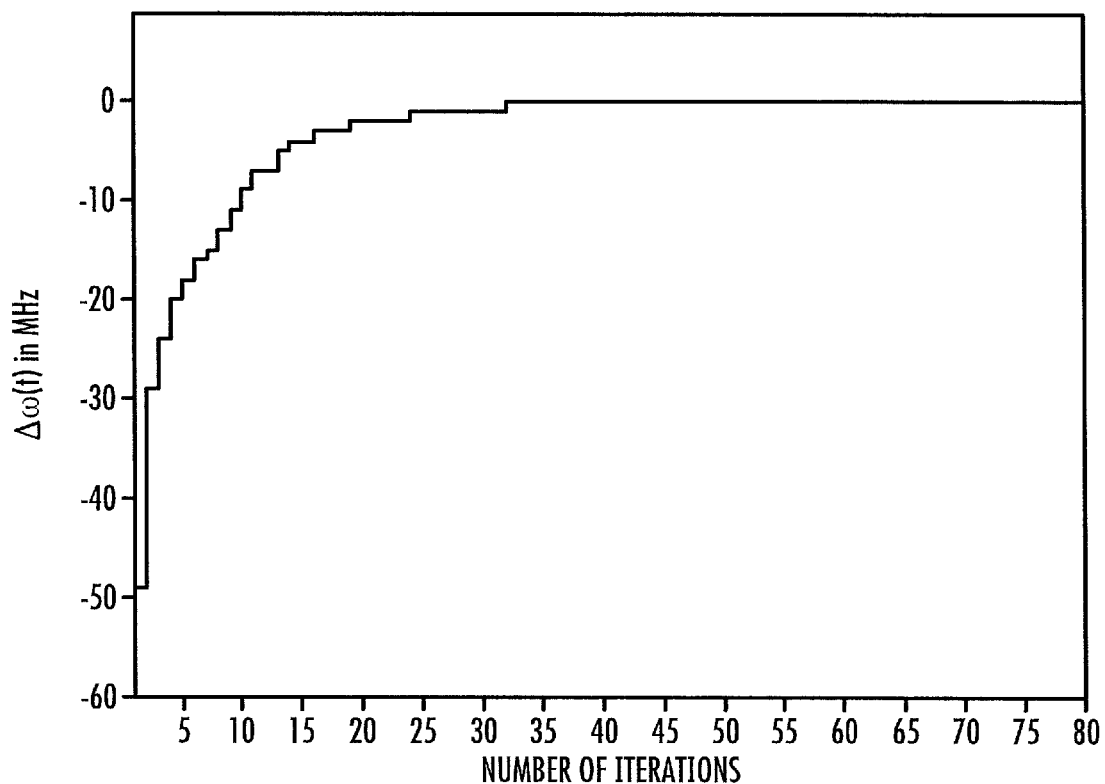
FIGS. 15 and 16 are graphs illustrating measured filter frequency control loop transient response for embodiments of the presently disclosed subject matter.

The loop performance and locking time can be evaluated in high or low loop gain conditions. Due to the digital nature of the tunable notch filter, only certain discrete frequency states are possible, which explains the expected step behavior of locking time response curves FIG. 15 shows the filter transient response when the initial frequency offset $\Delta\omega_o$=49 MHz and the loop gain A=0.4. In this case, approximately 35 iterations were needed to achieve convergence yielding an estimated locking time of 350 μs. This matches reasonably well with the predicted behavior of FIG. 10.

Figure 16:
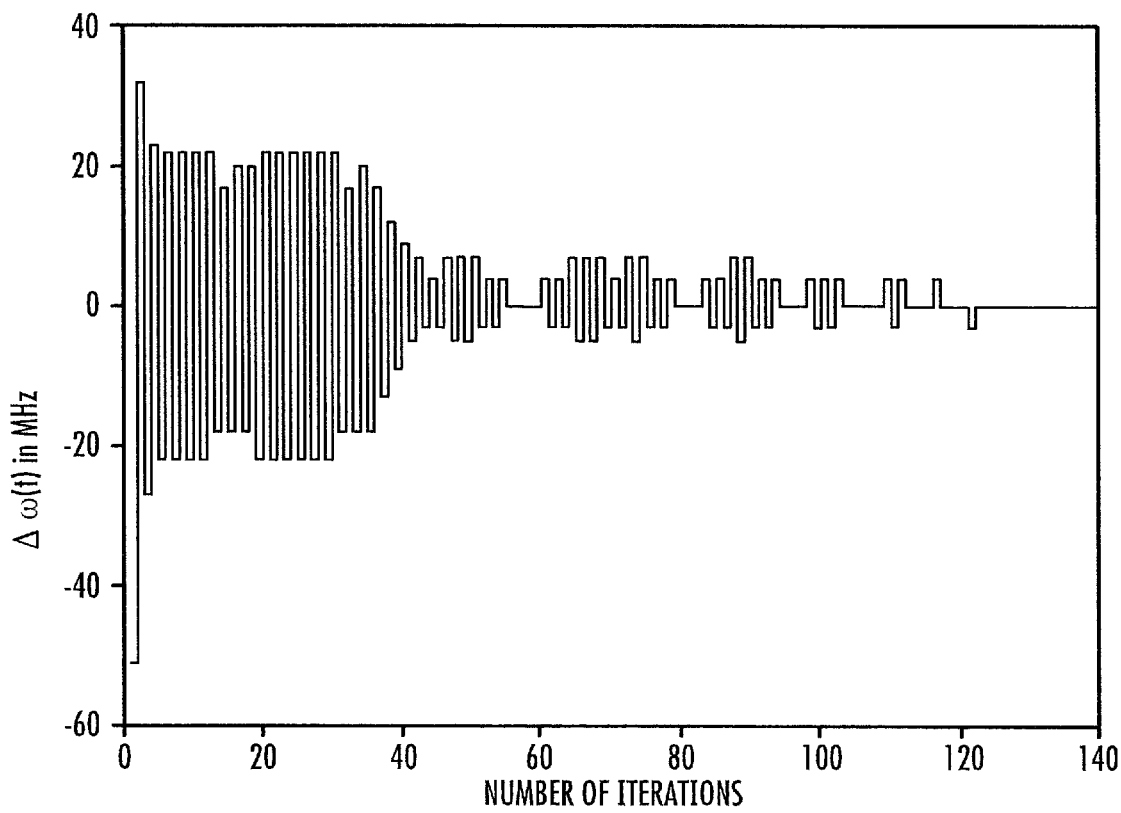

FIG. 16 shows the transient response when the gain is increased to A=3. The system then presents oscillations that eventually are damped to reach convergence in approximately 125 iterations (1250 μs). Gains higher than A=3 can result in non-convergent situations.

From FIGS. 15 and 16, it can be concluded that, as predicted from simulation, it is important to properly set the overall loop gain in order to obtain the fastest locking time, smoothest exponential behavior and frequency convergence. In addition, high loop gains may potentially create undesired frequency fluctuations after convergence in case of system noise pick up.

The estimation of the filter frequency error in this practical discrete implementation can be a very challenging task for several reasons: (a) the tuning resolution of the present TDCA being 0.125 pF, the tunable digital filter can only achieve certain frequencies; (b) the noise pick-up of the discrete system is not negligible; and (c) the analog-to-digital convertor number of bits is limited. The final frequency error of this experimental filter frequency control loop will not exclusively depend on the quality factor of the components but will be considerably affected by the before mentioned factors.

Assuming these limitations, the final frequency for the above discrete implementation can be estimated by changing the filter external components to $L_1$=27 nH, $C_1$=0.1 pF, which reduces the step resolution to a maximum of 500 KHz at expenses of reduced notch tuning range of 5.6 MHz. As a consequence of increasing the inductor value, the overall Q factor can also be reduced, providing 15 dB notch rejection. The loop gain can be chosen as in FIG. 15 to avoid oscillations in the response.

An experiment conducted by choosing different $\Delta\omega_o=5$ MHz can result in a maximum recorded frequency error of 277 KHz for this particular implementation. The final frequency control error can be further reduced if the filter frequency tuning resolution and the overall Q factor increase.

Complete tunable filter systems and methods comprising an RF MEMS tunable notch filter and its associated frequency control loop have been described. The analysis and the derived closed form solutions and formulas have proven very useful to the design and implementation of the a tunable filter system such as disclosed herein. This tunable filter can be practically used in the transceivers of wireless mobile stations. It can be possibly integrated into mobile transceiver RF ICs. The notch filter frequency control loop formulation developed here is not only applicable to this specific filter topology, but can be applied to any narrowband band-stop tunable filters. Concepts of this tunable filtering system may be also used in the design of a more complex future tunable duplexer system.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

What is claimed is:

1. A tunable filter and control system, comprising:
   a tunable notch filter providing a stop band;
   a sensing circuit in communication with the tunable notch filter and adapted to determine a phase change between a reference signal and a signal reflected from the tunable notch filter; and
   a control loop in communication with the tunable notch filter and the sensing circuit, the control loop being operable to adjust the tunable notch filter to modify the phase change.

2. The system of claim 1, wherein the tunable notch filter is asymmetric to enable a low-loss passband near the stop band.

3. The system of claim 2, wherein the tunable notch filter comprises one or more pole-zero elements.

4. The system of claim 2, wherein the tunable notch filter comprises a series-LC resonator configured to resonate at a tunable notch filter frequency.

5. The system of claim 1, wherein the sensing circuit is integrated into the tunable notch filter.

6. The system of claim 1, wherein the sensing circuit comprises:
   a first RF amplifier configured to receive the signal reflected from the tunable notch filter and generate an amplified reflected signal;
   a second RF amplifier configured to receive the reference signal and generate an amplified reference signal; and
   a phase detector configured to compare the amplified reflected signal and the amplified reference signal.

7. The system of claim 1, wherein the tunable notch filter, the sensing circuit, and the control loop are integrated into a single module.

8. The system of claim 1, wherein the control loop is operable to change a center frequency of the notch filter such that the phase change upon reflection is zero degrees.

9. The system of claim 1, wherein the tunable notch filter and the sensing circuit are in communication with an input RF signal source;
   wherein the reference signal comprises a transmitter leakage signal contained in an input RF signal from the input RF signal source; and
   wherein the control loop is operable to change a center frequency of the notch filter to suppress the transmitted leakage signal from the input RF signal.

10. The system of claim 9, wherein the sensing circuit comprises a directional coupler in communication with the tunable notch filter and the input RF signal source.

11. The system of claim 1, comprising an additional tunable notch filter in communication with the control loop and an input RF signal source, wherein the control loop is operable to change a center frequency of the additional notch filter to suppress an unwanted signal from an input RF signal from the input RF signal source.

12. The system of claim 11, wherein the sensing circuit comprises a circulator in communication with the tunable notch filter and a reference signal source.

13. The system of claim 11, wherein the sensing circuit comprises a directional coupler in communication with the tunable notch filter and a reference signal source.

14. A method for rejecting a strongest signal on an input of a tunable filter and control system, the method comprising:
   receiving a reference signal at a tunable notch filter, wherein at least a portion of the reference signal is reflected by the tunable notch filter;
   sensing a phase change between the reference signal and the signal reflected from the tunable notch filter; and
   adjusting the tunable notch filter to modify the phase change.

15. The method of claim 14, wherein receiving a reference signal comprises receiving a transmitter local oscillator signal.

16. The method of claim 14, wherein receiving a reference signal comprises receiving a transmitter leakage signal.

17. The method of claim 14, wherein adjusting the tunable notch filter comprises modifying the phase change upon reflection to be zero degrees.

18. The method of claim 14, wherein adjusting the tunable notch filter comprises setting a center frequency of the notch filter to be equal to a frequency of the reference signal.

* * * * *